US010283478B2

(12) United States Patent
Omote et al.

(10) Patent No.: US 10,283,478 B2
(45) Date of Patent: May 7, 2019

(54) PRESSURE CONTACT TYPE SEMICONDUCTOR DEVICE STACK

(71) Applicants: Toshiba Mitsubishi-Electric Industrial Systems Corporation, Chuo-ku (JP); Toshiba Energy Systems & Solutions Corporation, Kawasaki-shi (JP)

(72) Inventors: Kenichiro Omote, Tokyo (JP); Ryo Nakajima, Tokyo (JP); Makoto Mukunoki, Tokyo (JP); Daisuke Yoshizawa, Tokyo (JP); Yuta Ichikura, Tokyo (JP); Naotaka Iio, Saitama-ken (JP)

(73) Assignees: Toshiba Mitsubishi-Electric Industrial Systems Corporation, Chuo-ku (JP); Toshiba Energy Systems & Solutions Corporation, Kawasaki-shi (JP)

( * ) Notice: Subject to any disclaimer, the term of this patent is extended or adjusted under 35 U.S.C. 154(b) by 0 days.

(21) Appl. No.: 15/786,928

(22) Filed: Oct. 18, 2017

(65) Prior Publication Data

US 2018/0040581 A1    Feb. 8, 2018

Related U.S. Application Data

(63) Continuation of application No. PCT/JP2015/002254, filed on Apr. 27, 2015.

(51) Int. Cl.
*H01L 23/00* (2006.01)
*H01L 25/11* (2006.01)
(Continued)

(52) U.S. Cl.
CPC ............ *H01L 24/72* (2013.01); *H01L 23/367* (2013.01); *H01L 23/4006* (2013.01);
(Continued)

(58) Field of Classification Search
CPC .............................. H01L 24/72; H01L 23/367
See application file for complete search history.

(56) References Cited

U.S. PATENT DOCUMENTS

| 2002/0089056 | A1* | 7/2002 | Eady | H05K 7/1424 |
| | | | | 257/712 |
| 2011/0134609 | A1* | 6/2011 | Folts | H01L 23/4006 |
| | | | | 361/717 |

(Continued)

FOREIGN PATENT DOCUMENTS

| JP | 7-273279 A | 10/1995 |
| JP | 8-330484 A | 12/1996 |
| JP | 2006-128464 A | 5/2006 |

*Primary Examiner* — Walter H Swanson
(74) *Attorney, Agent, or Firm* — Oblon, McClelland, Maier & Neustadt, L.L.P.

(57) ABSTRACT

To provide a pressure contact type semiconductor device stack which can uniformly pressurize pressure contact type semiconductor devices irrespective of presence or absence of a notch portion of the pressure contact type semiconductor device, and can prevent thermal destruction of the relevant pressure contact type semiconductor device.

A pressurizing device for pressurizing between pressure contact type semiconductor devices and heat sinks which have been stacked is provided with pressuring bodies arranged at the upper and lower surfaces, metal fittings for insulating plate each for distributing a pressure applied by the pressuring body to an outer circumferential surface, and insulating plates each for pressuring the relevant heat sinks by the pressure applied to a pressurizing surface of the relevant metal fitting for insulating plate, the pressure contact type semiconductor device has a notch portion at a part of a peripheral portion of a post surface of any one of a collector post surface or an emitter post surface, and a device for making a distance from a pressurizing surface of the metal fitting for insulating plate pressurized by the upper (Continued)

surface pressurizing body to a front surface of a chip equal to a distance from a pressurizing surface of the metal fitting for insulating plate pressurized by the lower surface pressurizing body to a back surface of a chip is provided.

14 Claims, 8 Drawing Sheets

(51) Int. Cl.
*H01L 23/367* (2006.01)
*H01L 23/40* (2006.01)
*H01L 23/473* (2006.01)

(52) U.S. Cl.
CPC .......... *H01L 23/4012* (2013.01); *H01L 24/90* (2013.01); *H01L 25/11* (2013.01); *H01L 23/473* (2013.01); *H01L 2924/351* (2013.01)

(56) References Cited

U.S. PATENT DOCUMENTS

| | | | | |
|---|---|---|---|---|
| 2013/0105994 A1* | 5/2013 | Colgan | ................. | H01L 23/433 |
| | | | | 257/782 |
| 2014/0313642 A1* | 10/2014 | Zhang | .................... | H01L 25/112 |
| | | | | 361/637 |
| 2016/0329264 A1* | 11/2016 | Ekwall | ................. | H01L 23/4006 |
| 2017/0162470 A1* | 6/2017 | Brehm | ................. | H01L 23/4012 |

* cited by examiner

CASE IN WHICH THICKNESS
OF WATER-COOLED
HEAT SINK IS MADE THICKER

CASE IN WHICH THICKNESS OF
INSULATING PLATE IS MADE THICKER (1) NOTCH IS PRESENT IN MULTI-CHIP SEMICONDUCTOR DEVICE (2)

*DISTANCE Lc FROM COLLECTOR POST SURFACE TO CHIP UPPER SURFACE AND DISTANCE Le FROM EMITTER POST SURFACE TO CHIP LOWER SURFACE ARE DIFFERENT

US 10,283,478 B2

PRESSURE CONTACT TYPE SEMICONDUCTOR DEVICE STACK

TECHNICAL FIELD

Embodiments of the present invention relate to a pressure contact type semiconductor device stack composing a stack unit in a power conversion apparatus.

BACKGROUND ART

In the case of applying pressure contact type semiconductor devices (press pack semiconductor devices, for example) each composed of a multi-chip semiconductor device to a large capacity power conversion apparatus, in order to cool the pressure contact type semiconductor devices, a method is used in which the pressure contact type semiconductor devices and heat sinks are alternately stacked, and the pressure contact type semiconductor devices and the heat sink that have been alternately stacked are pressure-contacted and are cooled. When these are pressurized by base plates each composed of a flat pressurizing body as this pressurizing method, there may be a case in which since a pressurizing area thereof is large, unbalanced load that pressure is partially unbalanced is generated when the pressurizing surface is not flat, or the adhesiveness thereof is not good. In order to prevent this, a central portion of a press pack semiconductor device is pressurized with a pressurizing surface of a spherical shape, and thereby the unbalanced load is prevented (Refer to Patent Document 1, for example.).

However, in the method of Patent Document 1, there has been a problem that since the central portion of a press pack semiconductor device is pressurized, the pressurized pressure is decreased from the central portion toward the outer circumferential surface, and thereby it is difficult to uniformly pressurize the press pack semiconductor device, and thermal destruction is easily generated at the outer circumferential surface portion of the press pack semiconductor device. As a method for preventive this, a press pack semiconductor device stack which pressurizes pressure contact type semiconductor devices and heat sinks shown in FIG. 7 has been considered.

FIG. 7 is a sectional view of a pressure contact type semiconductor device stack 200 according to a conventional art which has an effect for preventing thermal destruction of devices composing a pressure contact type semiconductor device at the outer circumferential surface. The pressure contact type semiconductor device stack 200 shown in the drawing has a configuration in which pressure contact type semiconductor devices 10 and water-cooled heat sinks 9 are alternately stacked, and metal fittings 7 for insulating plate arranged at the both ends are pressurized from the outside to the inside. The above-described metal fittings 7 for insulating plate (a collective term of the metal fittings 7a, 7b for insulating plate) have been subjected to counter boring in the both surfaces thereof. Pressure is also applied to the outer circumferential surface of the pressure contact type semiconductor device by performing counter boring. As a result of this, it is possible to prevent thermal destruction of the above-described devices at the outer circumferential surface of the pressure contact type semiconductor device (the press pack semiconductor device).

FIG. 8 shows a configuration of the multi-chip semiconductor device 10 as an example of the pressure contact type semiconductor device 10. Here, there may be a case to describe it as the pressure contact type semiconductor device 10 or the multi-chip semiconductor device 10 depending on the content of the description, but the description will be made assuming that they are the same ones. FIG. 8(1) is a plan view of the pressure contact type semiconductor device 10, and FIG. 8(2) is an A-A sectional view of the pressure contact type semiconductor device 10 shown in FIG. 8(1). The pressure contact type semiconductor device 10 shown in the drawing is provided with a notch portion 10b. In addition, the pressure contact type semiconductor device 10 is configured so that a plurality of chips 10a are arranged on the same plane.

PRIOR ART DOCUMENT

Patent Document

Patent Document 1: Japanese Patent Application Publication No. 2003-168778

SUMMARY OF THE INVENTION

Problem to be Solved by the Invention

However, the chip 10a of the above-described pressure contact type semiconductor device 10 is not arranged at the central portion in the thickness direction of the pressure contact type semiconductor device 10, but the chip 10a is arranged at a position in which the front surface of the chip 10a is distant from a collector post surface 10c that is the front surface of the pressure contact type semiconductor device 10 by a distance Lc, and at a position in which the back surface of the chip 10a is distant from an emitter post surface 10d that is the back surface of the pressure contact type semiconductor device 10 by a distance Le (Refer to FIG. 8(2).). That is the distance Lc from the collector post surface 10c of the pressure contact type semiconductor device 10 to the front surface of the chip 10a is different from the distance Le from the emitter post surface 10d to the back surface of the chip 10a is different (Lc<Le).

In addition, since the notch portion 10b shown in FIG. 8(1) is present, there has been a problem that, decrease in pressure is generated by the matter that the pressure is not applied to the notch portion 10b, and even when the above-described counter boring shown in FIG. 7 has been performed, it is not possible to uniformly pressurize the pressure contact type semiconductor device 10.

The present invention has been made to solve the above-described problem, and makes it an object to provide a pressure contact type semiconductor device stack which is composed by stacking a plurality of pressure contact type semiconductor devices each composed of multi chips, is provided with pressurizing means for pressurizing metal fittings for insulating plate arranged at the both ends of the stack from the outside to the inside, makes distances from pressurizing surfaces of the relevant metal fittings for insulating plate arranged at the upper and lower ends to the chip front surface or the chip back surface equal to each other, and thereby can uniformly pressurize the relevant pressure contact type semiconductor devices irrespective of presence or absence of a notch portion of the pressure contact type semiconductor device, and can prevent thermal destruction of the relevant pressure contact type semiconductor device.

Means for Solving the Problem

In order to achieve the above-described object, a pressure contact type semiconductor device stack according to Claim 1 of the present invention is a pressure contact type semiconductor device stack comprising pressure contact type semiconductor devices each composed of a multi-chip semiconductor device in which a plurality of chips are arranged on the same plane, heat sinks which are to be arranged on both surfaces of the pressure contact type semiconductor device, the pressure contact type semiconductor devices and the heat sinks being alternately stacked, a pressurizing device for pressurizing the pressure contact type semiconductor devices and the heat sinks so that a pressure contact force between the pressure contact type semiconductor device and the heat sink which have been stacked becomes a prescribed pressure contact force, the pressurizing device including pressurizing bodies arranged on an upper surface and a lower surface of the pressure contact type semiconductor devices and the heat sinks which have been stacked, metal fittings for insulating plate each distributing a pressure applied by the pressuring body to an outer circumferential surface, and insulating plates, each of which is arranged between a pressurizing surface of the metal fitting for insulating plate and the heat sink arranged the nearest to the pressurizing surface of the relevant metal fitting for insulating plate, and pressurizes the relevant heat sink by a pressure applied to the pressuring surface of the relevant metal fitting for insulating plate, the pressure contact type semiconductor device comprising a collector post surface at one side that is a pressure contact surface, an emitter post surface at the other side arranged opposite to the collector post surface, a notch portion at a part of a peripheral portion of a post surface of any one of the collector post surface or the emitter post surface, and chips which are arranged between the collector post surface and the emitter post surface in parallel with the pressure contact surface, and are arranged so that a distance from the collector post surface to a front surface of the chip and a distance from the emitter post surface to a back surface of the chip are different, and a device for making a distance from the pressurizing surface of the metal fitting for insulating plate pressurized by the upper surface pressurizing body to a front surface of the chip of the pressure contact type semiconductor device arranged the nearest to the pressurizing surface, equal to a distance from the pressurizing surface of the metal fitting for insulating plate pressurized by the lower surface pressurizing body to a back surface of the chip of the pressure contact type semiconductor device arranged the nearest to the pressurizing surface.

Effects of the Invention

According to this invention, a pressure contact type semiconductor device stack according to the present invention is composed by stacking a plurality of pressure contact type semiconductor devices each composed of multi chips, is provided with pressurizing means for pressurizing metal fittings for insulating plate arranged at the both ends of the stack from the outside to the inside, makes distances from pressurizing surfaces of the metal fittings for insulating plate arranged at the upper and lower ends to the chip front surface or the chip back surface made equal to each other, and thereby can uniformly pressurize the relevant pressure contact type semiconductor devices irrespective of presence or absence of a notch portion of the pressure contact type semiconductor device, and can prevent thermal destruction of the relevant pressure contact type semiconductor device.

EMBODIMENTS TO PRACTICE THE INVENTION

Hereinafter, embodiments of the present invention will be described with reference to the drawings.

Embodiment 1

Figure 1:
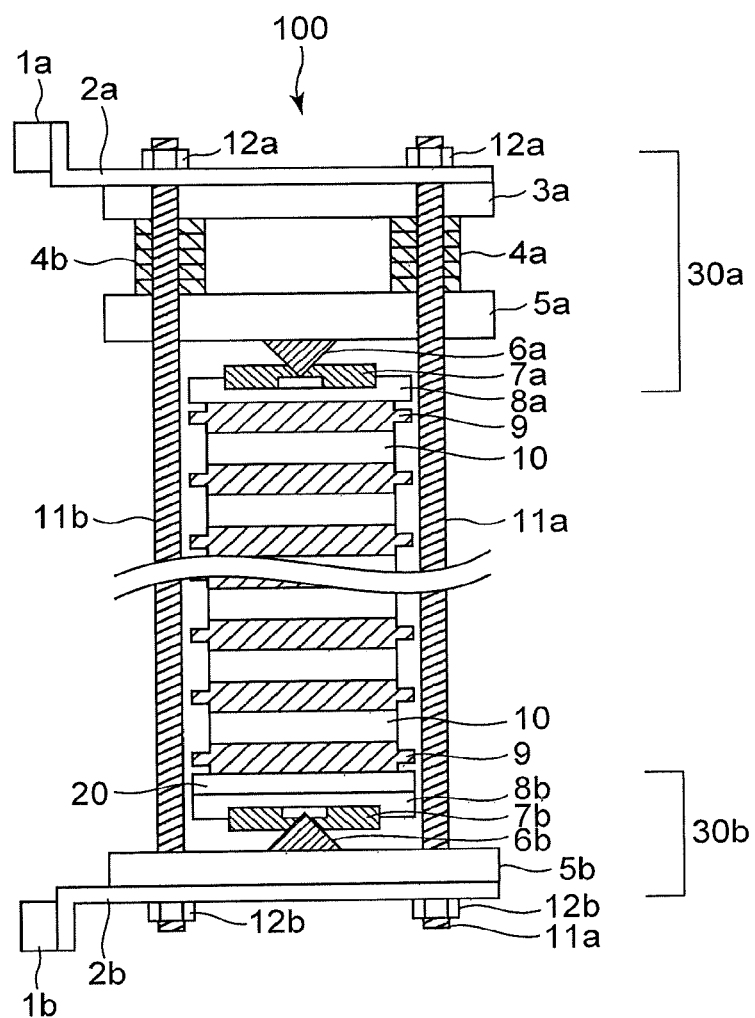
FIG. 1 A sectional view of a pressure contact type semiconductor device stack according to an embodiment 1.

FIG. 1 is a sectional view of a pressure contact type semiconductor device stack 100 according to an embodiment 1. The pressure contact type semiconductor device stack 100 is composed of pressure contact type semiconductor devices 10 each composed of multi chips, water-cooled heat sinks 9 for cooling the relevant pressure contact type semiconductor devices 10, and an upper pressurizing portion (pressurizing means) 30a and a lower pressurizing portion (pressurizing means) 30b which pressurize these and so on.

In the embodiment, since a plurality of sets each composed of the water-cooled heat sink 9 and the pressure contact type semiconductor device 10 are stacked in series, the pressure contact type semiconductor device 10 is arranged between the water-cooled heat sink 9 and the water-cooled heat sink 9, and thereby the pressure contact type semiconductor device 10 is cooled from the upper surface and the lower surface. The drawing shows one example of a case configured like this.

A pressurizing portion 30 (a collective term of the pressurizing portions 30a, 30b) is composed of pressure contact plates 2a, 2b, stays 11a, 11b, a base plate 3a, elastic bodies 4a, 4b as energizing means, base plates 5a, 5b, conical pressurizing bodies 6a, 6b, metal fittings 7a, 7b for insulating plate, and insulating plates 8a, 8b and so on, and pressurizes the pressure contact type semiconductor devices 10 and the water-cooled heat sinks 9 so that the pressure contact force between them which have been stacked between the pressure contact plates 2a, 2b become a prescribed pressure contact force.

The base plates 5a, 5b, the conical pressurizing bodies 6a, 6b, the metal fittings 7a, 7b for insulating plate, and the insulating plates 8a, 8b, and the pressure contact type semiconductor devices 10 and the water-cooled heat sinks 9 are pressurized by repulsive forces of the elastic bodies 4a, 4b, so that the pressure contact type semiconductor devices 10 and the water-cooled heat sinks 9 are pressurized by a definite pressure contact force. In addition, it is possible to finely adjust the above-described pressure contact force within a prescribed pressure range by the repulsive force of the elastic bodies 4a, 4b, by adjusting nuts 12a, 12a, and nuts 12b, 12b.

In the present embodiment, a spacer 20 is arranged between the lowermost water-cooled heat sink 9 and the insulating plate 8b. This spacer 20 is arranged so that a distance from the lower portion (a pressurizing surface for the insulating plate 8a) of the metal fitting 7a for insulating plate which has been subjected to counter boring to a front surface of the chip of the pressure contact type semiconductor device 10 becomes equal to a distance from the upper portion (a pressurizing surface for the insulating plate 8b) of the metal fitting 7b for insulating plate to a back surface of the chip of the pressure contact type semiconductor device 10.

In the case in which the pressurizing surface is a plane, when a degree of adhesion between the pressure contact type semiconductor device and the pressurizing surface is bad due to the processing accuracy thereof, unbalanced load is generated on the pressurizing surface, and thereby a case in which the pressure contact type semiconductor device cannot be uniformly pressurized may be generated. The conical pressurizing bodies 6a, 6b can prevent the generation of the above-described unbalanced load.

The counter boring in the both surfaces of the metal fittings 7a, 7b for insulating plate each distributes the pressure applied by the conical pressurizing body to the outer circumferential surface thereof. As a result, it is possible to prevent that the pressure applied to devices (chips) composing the pressure contact type semiconductor device at the outer circumferential surface is decreased, and thereby thermal destruction of the devices (chips) composing the pressure contact type semiconductor device at the outer circumferential surface can be prevented.

The insulating plate 8a pressurizes the water-cooled heat sink 9 contacting with the relevant insulating plate 8a by the pressure applied by the metal fitting 7a for insulating plate. Similarly, the insulating plate 8b pressurizes the water-cooled heat sink 9 contacting with the relevant insulating plate 8b by the pressure applied by the metal fitting 7b for insulating plate.

Figure 2:
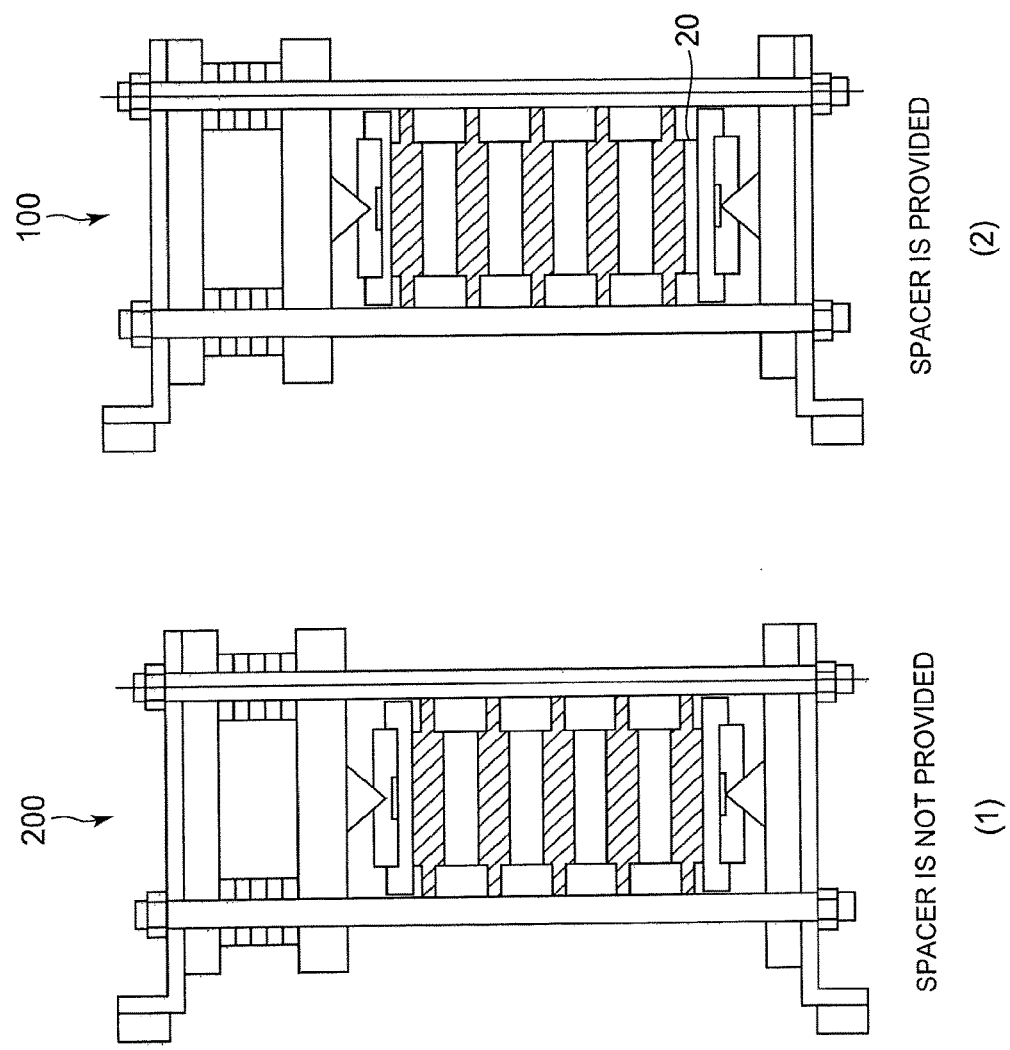
FIG. 2 A sectional view of pressure contact type semiconductor device stacks in the case in which the spacer 20 is not provided in the pressure contact type semiconductor device stack according to FIG. 1 (the spacer is not provided), and in the case in which the spacer 20 is provided (the spacer is provided).

FIG. 2 is a sectional view of the pressure contact type semiconductor device stack 200 in the case in which the spacer 20 is not provided in the pressure contact type semiconductor device stack according to FIG. 1 (refer to FIG. 2(1): the spacer is not provided), and the pressure contact type semiconductor device stack 100 in the case in which the spacer 20 is provided (refer to FIG. 2(2): the spacer is provided).

Figure 3:
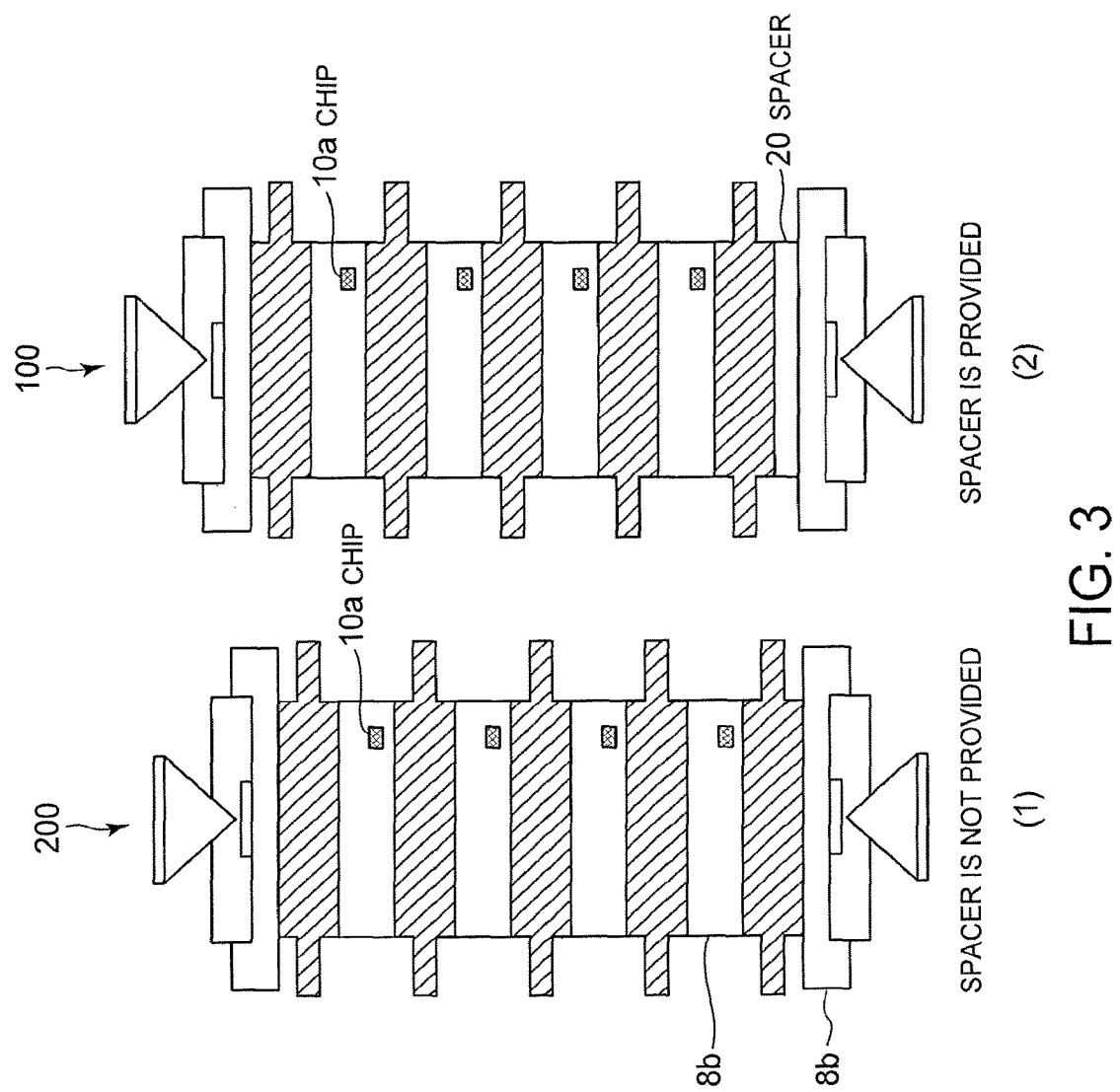
FIG. 3 A sectional view of main portions showing arrangement positions of the chips 10a in the pressure contact type semiconductor device stack in the case in which the spacer 20 is not provided in the pressure contact type semiconductor device stack shown in FIG. 2 (the spacer is not provided), and arrangement positions of the chips 10a in the pressure contact type semiconductor device stack in the case in which the spacer 20 is provided (the spacer is provided).

FIG. 3 is a sectional view of main portions showing arrangement positions of the chips 10a in the pressure contact type semiconductor device stack 200 in the case in which the spacer 20 is not provided in the pressure contact type semiconductor device stack shown in FIG. 2 (refer to FIG. 3(1): the spacer is not provided), and arrangement positions of the chips 10a in the pressure contact type semiconductor device stack 100 in the case in which the spacer 20 is provided (refer to FIG. 3(2): the spacer is provided).

Figure 4:
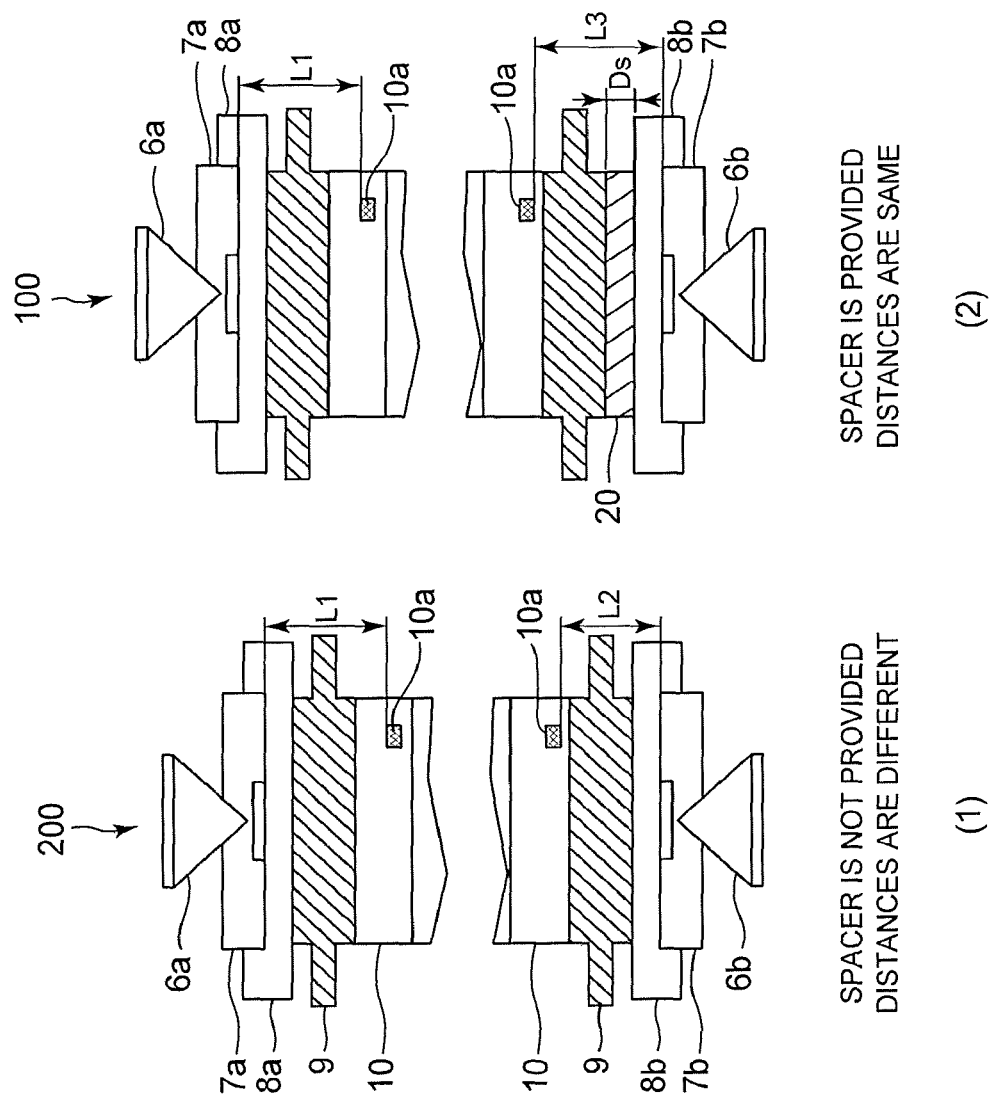
FIG. 4 A sectional view of main portions of the pressure contact type semiconductor device stacks each showing the difference between respective distances from the pressurizing surfaces of the metal fittings for insulating plate to a front surface (a back surface) of the chips, in the case in which the spacer 20 is not provided in the pressure contact type semiconductor device stack shown in FIG. 3 (FIG. 4(1) the spacer is not provided), and in the case in which the spacer 20 is provided (FIG. 4(2) the spacer is provided).

FIG. 4 is a sectional view of main portions of the pressure contact type semiconductor device stacks in the case in which the spacer 20 is not provided in the pressure contact type semiconductor device stack shown in FIG. 3 (refer to FIG. 4(1): the spacer is not provided), and in the case in which the spacer 20 is provided (refer to FIG. 4(2): the spacer is provided). And FIG. 4 shows the differences between distances L1, L1 each of which is a distance from the pressurizing surface of the metal fitting 7a for insulating plate to a front surface of the chip 10a of the pressure contact type semiconductor device 10 arranged the nearest thereto, and distances L2, L3 each of which is a distance from the pressurizing surface of the metal fitting 7b for insulating plate to a back surface of the chip 10a of pressure contact type semiconductor device 10 arranged the nearest thereto, respectively In FIG. 4(1), in the case in which the spacer 20 is not provided, with respect to the distance L1 from the pressurizing surface of the metal fitting 7a for insulating plate to the front surface of the chip 10a of the pressure contact type semiconductor device 10 arranged the nearest thereto, and the distance L2 from the pressurizing surface of the metal fitting 7b for insulating plate to the back surface of the chip 10a of the pressure contact type semiconductor device 10 arranged the nearest thereto, L1>L2.

That is, with respect to the distance L1 from the pressurizing surface of the metal fitting 7a for insulating plate to the front surface of the chip 10a of the pressure contact type semiconductor device 10 arranged the nearest thereto, and the distance L2 from the pressurizing surface of the metal fitting 7b for insulating plate to the back surface of the chip 10a of the pressure contact type semiconductor device 10 arranged the nearest thereto, since the arrangement position of the chip 10a in the pressure contact type semiconductor device 10 is not structurally located at the central portion in the thickness direction, L1>L2.

Figure 7:
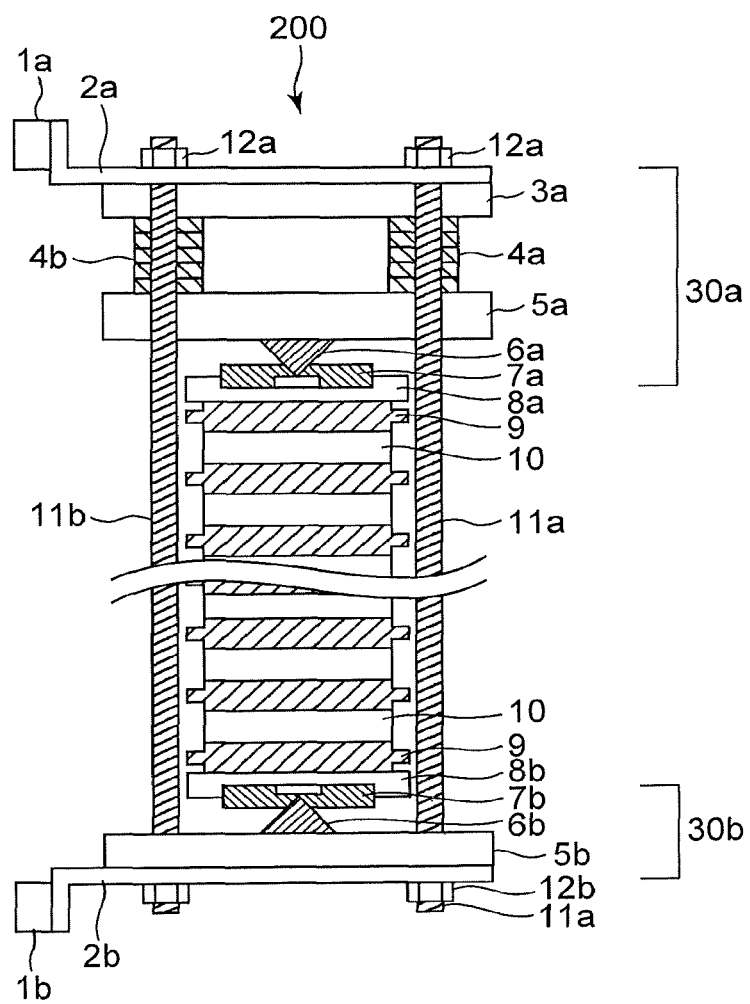
FIG. 7 A sectional view of a pressure contact type semiconductor device stack according to a conventional art which has an effect of preventing thermal destruction of devices composing a pressure contact type semiconductor device at the outer circumferential surface.
Figure 8:
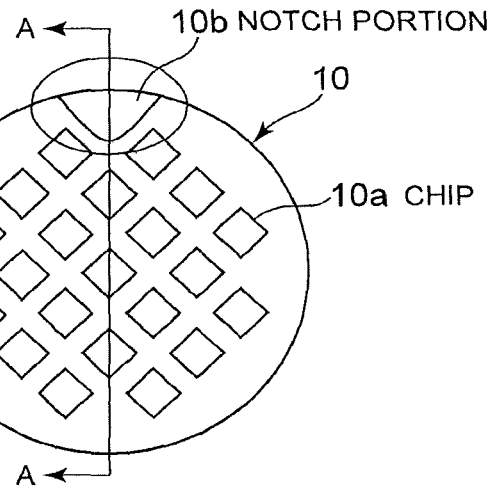
FIG. 8 A configuration diagram of a multi-chip semiconductor device as an example of the pressure contact type semiconductor device.
Figure 8:
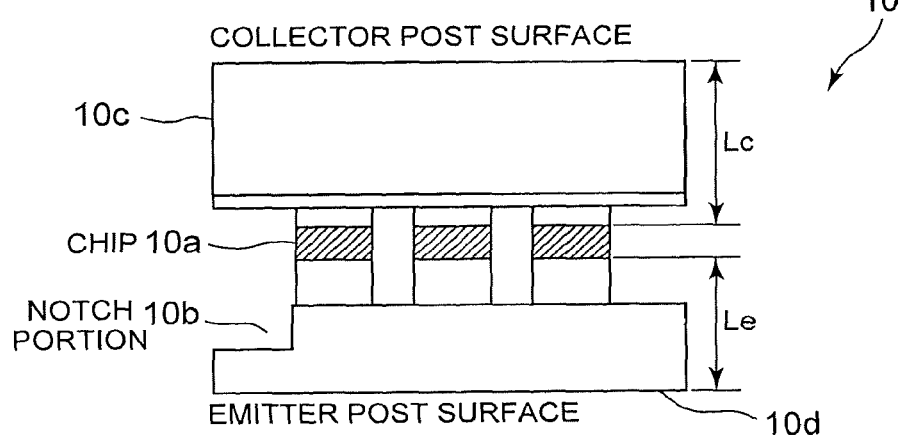

In addition, the notch portion 10b is provided at an emitter portion in the pressure contact type semiconductor device 10 as shown in FIG. 8(1), and as a result of measuring pressure distribution of the relevant pressure contact type semiconductor device 10 in the conventional pressure contact type semiconductor device stack 200 shown in FIG. 7, it has been found that pressures applied to the chips 10a (for example, a chip No. 18 and a chip No. 21) at the periphery of the notch portion 10b of the relevant pressure contact type semiconductor device 10 are decreased (decrease in pressure is generated).

It has been found that the above-described decrease in pressure is remarkably generated when a position of the notch portion 10b shown in FIG. 8(2) is close to a pressurizing surface of the metal fitting for insulating plate.

The above-described decrease in pressure can be prevented by making a distance between the pressurizing surface of the metal fitting 7b for insulating plate and the notch portion 10b long.

In the present embodiment, the spacer 20 is arranged between the insulating plate 8b and the pressure contact type semiconductor device 10 as shown in FIG. 4(2), and a distance from the pressurizing surface of the metal fitting 7b for insulating plate to the lower surface of the chip 10a is made a distance L3 which is longer than the distance L2 in the case in which the spacer 20 is not provided as shown in FIG. 4(1) by a thickness Ds of the spacer 20, and thereby the above-described decrease in pressure can be prevented (the following expression (1)).

$$L3=L2+Ds=L1 \tag{1}$$

L1: the distance from the pressurizing surface of the metal fitting 7a for insulating plate to the upper surface of the chip 10a arranged the nearest to the pressurizing surface
L2: the distance from the pressurizing surface of the metal fitting 7b for insulating plate to the lower surface of the chip 10a arranged the nearest to the pressurizing surface when the spacer 20 is not provided
L3: the distance from the pressurizing surface of the metal fitting 7b for insulating plate to the lower surface of the chip 10a arranged the nearest to the pressurizing surface when the spacer 20 is provided
Ds: the thickness of the spacer 20

In the embodiment 1, the spacer 20 having the thickness (=Ds) equal to the difference between the distance L1 and the distance L2 is arranged between the insulating plate 8b and the water-cooled heat sink 9 at the side having the above-described shorter distance as described above, so that the distance L1 from the pressurizing surface of the metal fitting 7a for insulating plate to the upper surface of the chip 10a of the pressure contact type semiconductor device 10 arranged the nearest thereto, and the distance L2 from the pressurizing surface of the metal fitting 7b for insulating plate to the lower surface of the chip 10a of the pressure contact type semiconductor device 10 arranged the nearest thereto are made the same distance, and thereby the difference (=Ds) between the distances can be absorbed. As a result, it is possible to prevent the thermal destruction of the pressure contact type semiconductor device 10 due to the decrease in pressure of the notch portion 10b thereof.

In addition, in the above-described embodiment 1, the case in which the conical pressurizing body is used as the pressurizing body has been described, but the same effect can also be obtained in a case in which a spherical pressurizing body is used.

Embodiment 2

Figure 5:
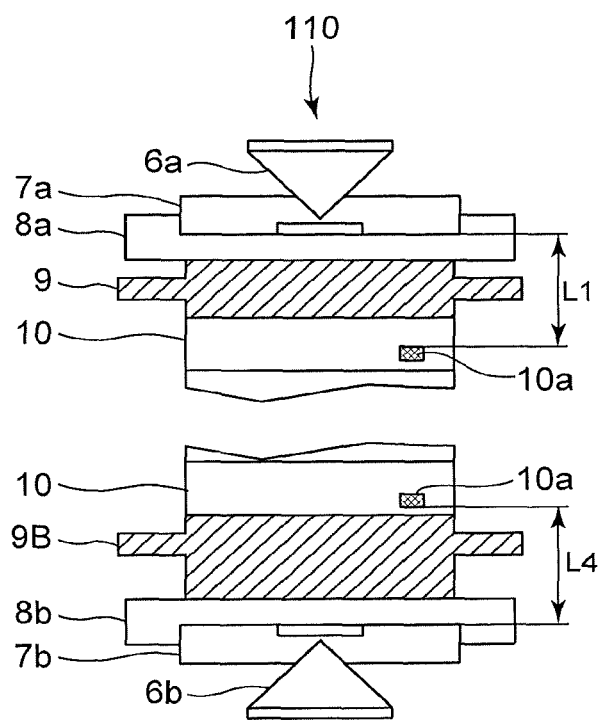
FIG. 5 A sectional view of a main portion of a pressure contact type semiconductor device stack according to an embodiment 2 in the case in which the thickness of the water-cooled heat sink is made thicker in place of providing the spacer.

FIG. 5 is a sectional view of a main portion of a pressure contact type semiconductor device stack 110 according to an embodiment 2 in the case in which the thickness of the water-cooled heat sink is made thicker in place of providing the spacer. The embodiment 2 is an example in the case in which a water-cooled heat sink 9B with a thickness that is thicker than the thickness of the water-cooled heat sink 9 arranged the nearest to the pressurizing surface of the metal fitting 7b for insulating plate is used, in place of arranging the spacer 20 according to the embodiment 1 shown in FIG. 4(2). In addition, since the other configuration thereof is the same as the content shown in the embodiment 1, the description thereof will be omitted.

In this case, the distance L1 from the pressurizing surface of the metal fitting 7a for insulating plate to the upper surface of the chip 10a arranged the nearest to the pressurizing surface, and a distance L4 from the pressurizing surface of the metal fitting 7b for insulating plate to the lower surface of the chip 10a arranged the nearest to the pressurizing surface is described below.

$$L4=L1 \tag{2}$$

L1: the distance from the pressurizing surface of the metal fitting 7a for insulating plate to the upper surface of the chip 10a arranged the nearest to the pressurizing surface
L4: the distance from the pressurizing surface of the metal fitting 7b for insulating plate to the lower surface of the chip 10a arranged the nearest to the pressurizing surface In the embodiment 2, the water-cooled heat sink 9B with a thickness that is thicker than the thickness of the water-cooled heat sink 9 contacting with the insulating plate 8b at the side having the above-described shorter distance is used as described above, so that the distance L1 from the pressurizing surface of the metal fitting 7a for insulating plate to the upper surface of the chip 10a of the pressure contact type semiconductor device 10 arranged the nearest thereto, and the distance L2 from the pressurizing surface of the metal fitting 7b for insulating plate to the lower surface of the chip 10a of the pressure contact type semiconductor device 10 arranged the nearest thereto are made the same distance, and thereby the difference between the distances can be absorbed. As a result, it is possible to prevent the thermal destruction of the pressure contact type semiconductor device 10 due to the decrease in pressure of the notch portion 10b thereof.

Embodiment 3

Figure 6:
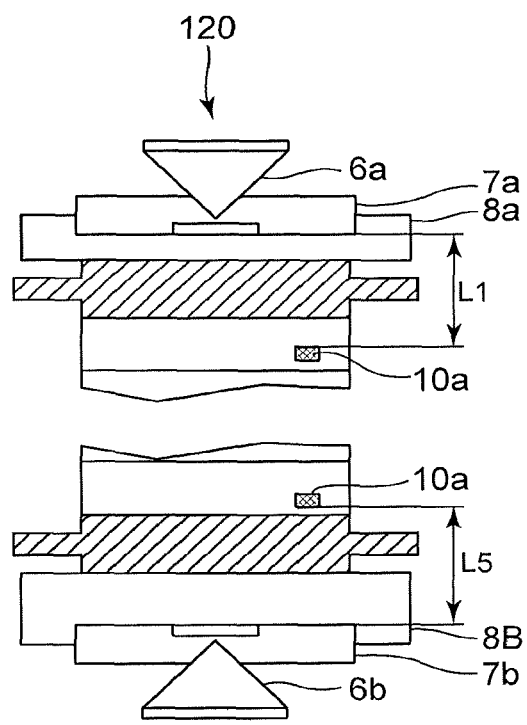
FIG. 6 A sectional view of a main portion of a pressure contact type semiconductor device stack according to an embodiment 3 in the case in which the thickness of the insulating plate is made thicker in place of providing the spacer.

FIG. 6 is a sectional view of a main portion of a pressure contact type semiconductor device stack 120 according to an embodiment 3. The embodiment 3 is an example in the case in which an insulating plate 8B with a thickness that is thicker than the thickness of the insulating plate 8b contacting with the pressurizing surface of the metal fitting 7b for insulating plate is used, in place of arranging the spacer 20 according to the embodiment 1 shown in FIG. 4(2). In addition, since the other configuration thereof is the same as the content shown in the embodiment 1, the description thereof will be omitted.

In this case, the distance L1 from the pressurizing surface of the metal fitting 7a for insulating plate to the upper surface of the chip 10a arranged the nearest to the pressurizing surface, and a distance L5 from the pressurizing surface of the metal fitting 7b for insulating plate to the lower surface of the chip 10a arranged the nearest to the pressurizing surface is described below.

$$L5=L1 \tag{3}$$

L1: the distance from the pressurizing surface of the metal fitting 7a for insulating plate to the upper surface of the chip 10a arranged the nearest to the pressurizing surface
L5: the distance from the pressurizing surface of the metal fitting 7b for insulating plate to the lower surface of the chip 10a arranged the nearest to the pressurizing surface.

In the embodiment 3, the thickness of the insulating plate 8A arranged at the side having the above-described shorter distance is made thicker, so that the distance L1 from the pressurizing surface of the metal fitting 7a for insulating plate to the upper surface of the chip 10a of the pressure contact type semiconductor device 10 arranged the nearest thereto, and the distance L2 from the pressurizing surface of the metal fitting 7b for insulating plate to the lower surface of the chip 10a of the pressure contact type semiconductor device 10 arranged the nearest thereto are made the same distance, and thereby the difference between the distances can be absorbed. As a result, it is possible to prevent the thermal destruction of the pressure contact type semiconductor device 10 due to the decrease in pressure of the notch portion 10b thereof.

As described above, it is possible to provide the pressure contact type semiconductor device which can prevent the thermal destruction of the pressure contact type semiconductor device due to the decrease in pressure of the notch portion of the pressure contact type semiconductor device that is a problem of the present invention.

DESCRIPTION OF THE SYMBOLS 2a, 2b pressure contact plate
3a base plate
4a, 4b elastic body
5a, 5b base plate
6a, 6b conical pressurizing body
7a, 7b metal fitting for insulating plate
8a, 8b insulating plate
9 water-cooled heat sink
10 pressure contact type semiconductor device (multi-chip semiconductor device)
11a, 11b stay
20 spacer
30 pressurizing portion
100 pressure contact type semiconductor device stack having spacer
110 pressure contact type semiconductor device stack in which thickness of water-cooled heat sink is made thicker
120 pressure contact type semiconductor device stack in which thickness of insulating plate is made thicker
200 pressure contact type semiconductor device stack according to conventional art

The invention claimed is:

1. A pressure contact type semiconductor device stack comprising:
a plurality of pressure contact type semiconductor devices each composed of a multi-chip semiconductor device in which a plurality of chips are arranged on a same plane;
a plurality of heat sinks arranged such that the plurality of pressure contact type semiconductor devices and the plurality of heat sinks are alternately stacked where a first heat sink of the plurality of heat sinks is arranged on a first surface of a pressure contact type semiconductor device of the plurality of pressure contact type semiconductor devices and a second heat sink of the plurality of heat sinks is arranged on a second surface of the pressure contact type semiconductor device;
a pressurizing device for pressurizing the plurality of pressure contact type semiconductor devices and the plurality of heat sinks so that a pressure contact force between the pressure contact type semiconductor device and the first heat sink becomes a prescribed pressure contact force, wherein
the pressurizing device includes:
a plurality of pressurizing bodies including
a first pressurizing body arranged on an upper surface of the plurality of pressure contact type semiconductor devices and the plurality of heat sinks, and
a second pressurizing body arranged on a lower surface of the plurality of pressure contact type semiconductor devices and the plurality of heat sinks,
a plurality of metal fittings each distributing a pressure applied by one of the plurality of pressurizing bodies to an outer circumferential surface, and
a plurality of insulating plates, each of which is arranged between a pressurizing surface of one of the plurality of metal fittings and a heat sink of the plurality of heat sinks that is arranged nearest to the pressurizing surface of the one of the plurality of metal fittings and pressurizes the heat sink by a pressure applied to the pressuring surface of the one of the plurality of metal fittings;
the pressure contact type semiconductor device includes:
a collector post surface at one side of the pressure contact type semiconductor device that is a pressure contact surface,
an emitter post surface at a side of the pressure contact type semiconductor device arranged opposite to the collector post surface,
a first notch portion at a part of a peripheral portion of a post surface of any one of the collector post surface or the emitter post surface, and
a group of chips, of the plurality of chips, arranged between the collector post surface and the emitter post surface in parallel with the pressure contact surface, and arranged so that a distance from the collector post surface to a front surface of a chip of the group of chips and a distance from the emitter post surface to a back surface of the chip are different; and
a device for making a first distance, from the pressurizing surface of the metal fitting pressurized by the first pressurizing body to a front surface of a chip of a pressure contact type semiconductor device of the plurality of pressure contact type semiconductor devices arranged nearest to the pressurizing surface of the metal fitting pressurized by the first pressurizing body, equal to a second distance from the pressurizing surface of the metal fitting pressurized by the second pressurizing body to a back surface of a chip of a pressure contact type semiconductor device of the plurality of pressure contact type semiconductor devices arranged nearest to the pressurizing surface of the metal fitting pressurized by the second pressurizing body.

2. The pressure contact type semiconductor device stack according to claim 1, wherein:
the device includes a spacer which is arranged
between the insulating plate arranged between the pressurizing surface of the metal fitting pressurized by the first pressurizing body and the heat sink arranged nearest to the pressurizing surface of the metal fitting pressurized by the first pressurizing body when the first distance is shorter than the second distance in a case where the spacer is not provided, or
between the pressurizing surface of the metal fitting pressurized by the second pressurizing body and the heat sink arranged nearest to the pressurizing surface of the metal fitting pressurized by the second pressurizing body when the second distance is shorter than the first distance in the case where the spacer is not provided, and the spacer has a thickness that is equal to a difference between the first distance and the second distance in the case when the spacer is not provided.

3. The pressure contact type semiconductor device stack according to claim 2, wherein:
each of the plurality of pressurizing bodies includes a spherical pressurizing body or a conical pressurizing body.

4. The pressure contact type semiconductor device stack according to claim 2, wherein:
each of the plurality of metal fittings includes
a second notch portion which is subjected to counter boring at a pressure contact surface side, and
a surface which is bored so as to contact with a spherical pressurizing body at a contacting portion when the plurality of pressurizing bodies include the spherical pressurizing body, or a surface which is bored so as to contact with a conical pressuring body at a contacting portion when the plurality of pressurizing bodies include the conical pressurizing body, at a surface of a side opposite to the second notch portion.

5. The pressure contact type semiconductor device stack according to claim 1, wherein:
the device varies a thickness of the heat sink arranged nearest to the pressurizing surface of the metal fitting pressurized by the first pressurizing body when the first distance is shorter than the second distance in a case where a spacer is not provided to thereby absorb a difference between the first distance the second distance in the case where the spacer is not provided, or
varies a thickness of the heat sink arranged nearest to the pressurizing surface of the metal fitting pressurized by the second pressurizing body when the second distance is shorter than the first distance in the case where the spacer is not provided to thereby absorb the difference between the first distance and the second distance in the case where the spacer is not provided.

6. The pressure contact type semiconductor device stack according to claim 5, wherein:
the first heat sink is composed of a water-cooled heat sink.

7. The pressure contact type semiconductor device stack according to claim 5, wherein:
each of the plurality of pressurizing bodies includes a spherical pressurizing body or a conical pressurizing body.

8. The pressure contact type semiconductor device stack according to claim 5, wherein:
each of the plurality of metal fittings includes
a second notch portion which is subjected to counter boring at a pressure contact surface side, and
a surface which is bored so as to contact with a spherical pressurizing body at a contacting portion when the plurality of pressurizing bodies include the spherical pressurizing body, or a surface which is bored so as to contact with a conical pressuring body at a contacting portion when the plurality of pressurizing bodies include the conical pressurizing body, at a surface of a side opposite to the second notch portion.

9. The pressure contact type semiconductor device stack according to claim 1, wherein:
the device varies a thickness of the insulating plate arranged between the pressurizing surface of the metal fitting pressurized by the first pressurizing body and the heat sink arranged nearest to the pressurizing surface of the metal fitting pressurized by the first pressurizing body to thereby absorb a difference between the first distance and the second distance in a case where a spacer is not provided, or
varies a thickness of the insulating plate arranged between the pressurizing surface of the metal fitting pressurized by the second pressurizing body and the heat sink arranged nearest to the pressurizing surface of the metal fitting pressurized by the second pressurizing body to thereby absorb the difference between the first distance and the second distance in the case where the spacer is not provided.

10. The pressure contact type semiconductor device stack according to claim 9, wherein:
each of the plurality of pressurizing bodies includes a spherical pressurizing body or a conical pressurizing body.

11. The pressure contact type semiconductor device stack according to claim 9, wherein:
each of the plurality of metal fittings includes
a second notch portion which is subjected to counter boring at a pressure contact surface side, and
a surface which is bored so as to contact with a spherical pressurizing body at a contacting portion when the plurality of pressurizing bodies include the spherical pressurizing body, or a surface which is bored so as to contact with a conical pressuring body at a contacting portion when the plurality of pressurizing bodies include the conical pressurizing body, at a surface of a side opposite to the second notch portion.

12. The pressure contact type semiconductor device stack according to claim 1, wherein:
the first heat sink is composed of a water-cooled heat sink.

13. The pressure contact type semiconductor device stack according to claim 1, wherein:
each of the plurality of pressurizing bodies includes a spherical pressurizing body or a conical pressurizing body.

14. The pressure contact type semiconductor device stack according to claim 1, wherein:
each of the plurality of metal fittings includes
a second notch portion which is subjected to counter boring at a pressure contact surface side, and
a surface which is bored so as to contact with a spherical pressurizing body at a contacting portion when the plurality of pressurizing bodies include the spherical pressurizing body, or a surface which is bored so as to contact with a conical pressuring body at a contacting portion when the plurality of pressurizing bodies include the conical pressurizing body, at a surface of a side opposite to the second notch portion.

* * * * *